United States Patent [19]

Bushey

[11] Patent Number: 4,871,928
[45] Date of Patent: Oct. 3, 1989

[54] BICMOS DRIVER CIRCUIT WITH COMPLEMENTARY OUTPUTS

[75] Inventor: Thomas P. Bushey, Phoenix, Ariz.

[73] Assignee: Motorola Inc., Schaumburg, Ill.

[21] Appl. No.: 235,128

[22] Filed: Aug. 23, 1988

[51] Int. Cl.[4] ............................................. H03K 17/12
[52] U.S. Cl. .................................... 307/446; 307/451; 307/454; 307/570
[58] Field of Search ............... 307/443, 446, 451, 454, 307/475, 570, 270

[56] References Cited

U.S. PATENT DOCUMENTS

| | | | |
|---|---|---|---|
| 3,541,353 | 11/1970 | Seelbach et al. | 307/446 |
| 4,103,188 | 7/1978 | Morton | 307/446 X |
| 4,612,458 | 9/1986 | Vasseghi et al. | 307/443 X |
| 4,682,054 | 7/1987 | McLaughlin | 307/443 X |
| 4,701,642 | 10/1987 | Pricer | 307/446 |
| 4,719,370 | 1/1988 | Sugimoto | 307/446 |
| 4,733,110 | 3/1988 | Hara et al. | 307/443 X |
| 4,746,817 | 5/1988 | Banker et al. | 307/443 X |

Primary Examiner—David Hudspeth
Attorney, Agent, or Firm—Michael D. Bingham

[57] ABSTRACT

A BICMOS inverter circuit having a high input impedance, improved switching characteristics, low power requirements, high noise immunity, high drive capability, an increased output voltage swing, reduced body effect, high current drivability and improved power dissipation comprises a CMOS inverter for receiving an input signal and bipolar push-pull output transistors for supplying an output. An intermediate CMOS stage is coupled between the CMOS inverter and the bipolar push-pull output transistors and to power supply voltages in a manner that eliminates body effect.

6 Claims, 1 Drawing Sheet

BICMOS DRIVER CIRCUIT WITH COMPLEMENTARY OUTPUTS

FIELD OF THE INVENTION

This invention relates to inverter circuits and, in particular, to inverter circuits having a CMOS (complimentary metal oxide semiconductor) input stage and a bipolar output stage.

BACKGROUND OF THE INVENTION

Increased semiconductor technology has provided for the ability to fabricate a large number of semiconductor devices on one single chip. Bipolar circuits typically provide fast gate speeds, reduced delay per unit load, and have historically been the predominate technology applied in integrated circuits. CMOS (complementary metal-oxide-semiconductor) structures provide high noise immunity, high input impedance, and low power requirements, and have rapidly gained acceptance in the industry. However, a large CMOS structure is required when driving large capacitive loads and in most cases, several stages of scaled CMOS inverters are necessary in order to minimize the total delay. For BICMOS arrays having a large number of devices, it is desirable that each CMOS device be of small size. As the size of a MOS device is reduced, the transconductance of the device and consequently the ability to drive a heavy capacitive load is also reduced. Bipolar devices continue to be used for driving these capacitive loads due to their high current gain. In quiescent periods, the bipolar push-pull transistors do not dissipate power. During transient periods, the bipolar current gain allows faster charging and discharging of capacitive loads. This results in a significant decrease in metal and fanout delays. Furthermore, smaller CMOS devices may be used in the BICMOS circuit than those required in an all CMOS device circuit. Attempts to combine bipolar and MOS technology to achieve all of these results have been numerous in recent years.

One previously known circuit combining bipolar and MOS devices comprises a pair of push-pull NPN transistors. The upper NPN transistor has a collector connected to a first voltage source and the source of a P-channel device, an emitter connected to an output terminal and the collector of the lower NPN transistor, and a base connected to an input terminal and the gates of the P-channel device and an N-channel device. The lower NPN transistor has an emitter connected to a second voltage source and the source of the N-channel device, and a base connected to the drains of the P-channel and the N-channel devices. However, this circuit has a low impedance at the input terminal since the input terminal is connected to the base of the upper NPN transistor, and as the output switches from low to high, the lower transistor is slow to turn off causing a slow transition to the high output.

Another previously known circuit is described in U.S. Pat. No. 4,616,146. A BIMOS circuit comprises upper and lower NPN push-pull transistors having an output terminal coupled therebetween. A P-channel device has a source and a drain connected to the collector and base, respectively, of the upper transistor. An N-channel device has a source and drain connected to the base and collector, respectively, of the lower transistor. The gates of the P-channel and N-channel devices are connected to an input terminal.

Yet another previously known circuit is described in U.S. Pat. No. 4,649,294. Upper and lower NPN push-pull transistors have an output terminal coupled therebetween. A pair of MOS transistors are coupled to an input terminal for biasing the NPN push-pull transistors. A MOS transmission gate is coupled between the base of the upper NPN transistor and the output terminal for increasing the output voltage swing.

However, known BICMOS inverter circuits have high loss of current drivability and suffer from body effects on the MOS devices. These disadvantages impact the speed and efficiency of the inverting function.

Thus, what is needed is an integrated circuit combining CMOS and bipolar technology having a high input impedance, improved switching characteristics, low power requirements, high noise immunity, high drive capability, no body effect and improved power dissipation while providing an increased output voltage swing.

SUMMARY OF THE INVENTION

Accordingly, it is an object of the present invention to provide an improved BICMOS inverter circuit.

Another object of the present invention is to provide a BICMOS inverter circuit that eliminates body effects on the MOS devices.

Yet another object of the present invention is to provide a BICMOS inverter circuit which allows for high drive capability.

A further object of the present invention is to provide a BICMOS inverter circuit which provides both an output signal and the compliment of that output signal.

Still another object of the present invention is to provide an improved BICMOS logic gate having an increased output voltage swing.

Another object of the present invention is to provide an improved BICMOS logic gate having low power requirements.

Yet another object of the present invention is to provide an improved BICMOS logic gate having a high input impedance.

Another object of the present invention to provide an improved BICMOS logic gate having improved output signal switching characteristics.

Still another object of the present invention to provide an improved BICMOS logic gate having high noise immunity.

In carrying out the above and other objects of the invention in one form, there is provided a BICMOS circuit comprising an output terminal coupled between upper and lower bipolar push-pull transistors for providing high current drive capability along with no d.c. power dissipation. A first CMOS inverter is coupled between first and second supply voltage terminals and is coupled to an input terminal and to a base of both the upper and lower bipolar transistors for providing a biasing voltage thereto. A second CMOS inverter is coupled between the first and second supply voltage terminals and is coupled to the input terminal and to the output terminal for providing a voltage at the output terminal that varies in magnitude from the voltage on the first and second supply voltage terminals in response to an input signal on the input terminal.

The above and other objects, features, and advantages of the present invention will be better understood from the following detailed description taken in conjunction with the accompanying drawings.

DESCRIPTION OF THE PREFERRED EMBODIMENTS

Figure 1:
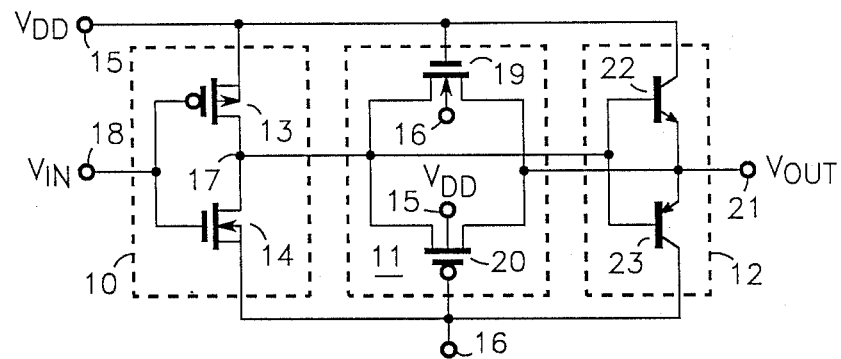
FIG. 1 is a schematic of a previously known inverter circuit.

Referring to FIG. 1, a prior art inverter circuit comprises an intermediate stage 11 coupled between a CMOS input stage 10 and a complimentary bipolar output stage 12. CMOS input stage 10 comprises a P-channel transistor 13 and an N-channel transistor 14 having their sources connected to power supply terminals 15 and 16, respectively, their drains connected to node 17, and their gates connected to input terminal 18. Intermediate stage 11 comprises an N-channel transistor 19 and a P-channel transistor 20 having their gates connected to power supply terminals 15 and 16, respectively, their drains connected to output terminal 21, and their sources connected to node 17. Output stage 12 comprises bipolar transistors 22 and 23 having their collectors connected to power supply terminals 15 and 16, respectively, their emitters connected to output terminal 21, and their bases connected to node 17.

Intermediate stage 11 is utilized to allow $V_{OUT}$ to swing rail to rail. Intermediate stage 11 also biases output stage 12 with a smaller voltage than would be required in the absence of intermediate stage 11.

Unfortunately, the current drive capability of the inverter circuit of FIG. 1 can be substantially reduced due to the presence of transistors 19 and 20 in parallel with the bipolar base-emitter junctions. Furthermore, due to the positioning of field effect transistors 19 and 20, the threshold voltage for these devices is increased, thus leading to degradation in circuit performance. The body effect on field effect transistors 19 and 20 is a result of the substrate connection to $V_{SS}$ and $V_{DD}$, respectively.

Figure 2:
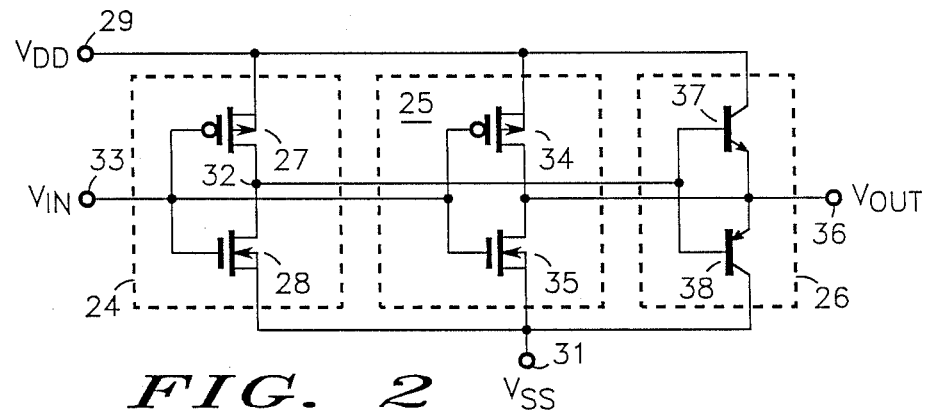
FIG. 2 is a schematic of the preferred embodiment of the present invention.

Referring to FIG. 2, a three stage complimentary BICMOS inverter circuit comprises an input stage 24, an input stage 25, and an output stage 26. The input stage 24 comprises a P-channel field effect transistor 27 and an N-channel field effect transistor 28 having their sources connected to power supply terminals 29 and 31, respectively, their drains connected to node 32, and their gates coupled to input terminal 33.

Input stage 25 comprises a P-channel field effect transistor 34 and an N-channel field effect transistor 35 having their sources coupled to power supply voltage terminals 29 and 31, respectively, their drains connected to output terminal 36, and their gates connected to input terminal 33. Both input stages 24 and 25 form a CMOS inverter that receives an input at input terminal 33 and supplies an output at node 32 and output terminal 36, respectively.

Output stage 26 comprises an NPN transistor 37 and a PNP transistor 38 having their collectors connected to power supply terminals 29 and 31, respectively, their emitters connected to output terminal 36, and their bases connected to node 32.

When a logic high signal is received at input node 33, transistor 27 is off and transistor 28 is on, causing node 32 to be low. Likewise, transistor 34 is off and transistor 35 is on, resulting in a low signal at output terminal 36. The low signal on node 32 turns transistor 37 off and transistor 38 on, causing output terminal 36 to go low.

When input terminal 33 receives a logic low signal, transistors 28, 35 and 38 are off and transistors 27, 34 and 37 are on, resulting in a logic high signal at output terminal 36. The circuit of FIG. 2 permits the output signal to swing rail to rail and also requires a voltage change at node 32 only equal to the base-emitter voltage to bias output stage 26. However, unlike the prior art circuit of FIG. 1, no body effects are encountered since the source and substrate of transistor 34 is coupled directly to the power supply voltage terminal 29 and the source and substrate of transistor 35 is coupled directly to power supply terminal 31. Furthermore, the circuit of FIG. 2 does not impede the bipolar current drivability.

Figure 3:
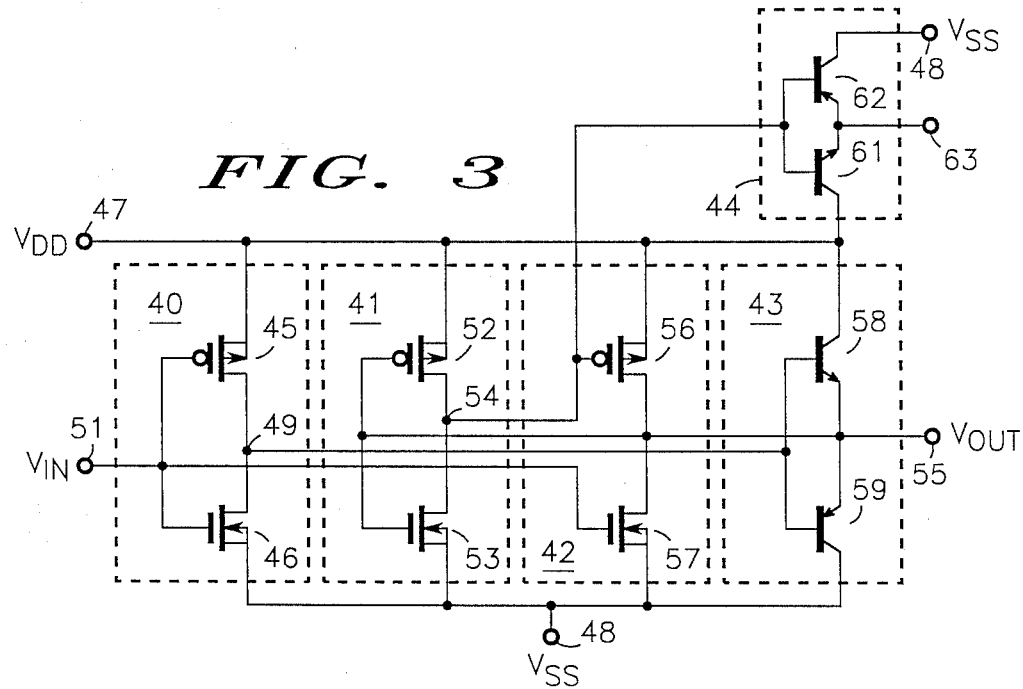
FIG. 3 is a schematic of a second embodiment of the present invention.

FIG. 3 illustrates a second embodiment of the present invention and comprises an input stage 40, an intermediate stage 41, an intermediate stage 42, an output stage 43, and an output stage 44. Input stage 40 comprises a P-channel field effect transistor 45 and an N-channel field effect transistor 46 having their sources connected to power supply terminals 47 and 48, respectively, their drains connected to node 49, and their gates connected to input terminal 51.

The intermediate stage 41 comprises a P-channel field effect transistor 52 and an N-channel field effect transistor 53 having their sources connected to power supply terminals 47 and 48, respectively, their drains connected to node 54, and their gates connected to output terminal 55.

Intermediate stage 42 comprises a P-channel field effect transistor 56 and an N-channel field effect transistor 57 having their sources connected to the power supply terminals 47 and 48, respectively, their drains connected to output terminal 55, and their gates connected to node 54 and input terminal 51, respectively.

The output stage 43 comprises an NPN bipolar transistor 58 and a PNP bipolar transistor 59 having their collectors connected to power supply voltage terminals 47 and 48, respectively, their emitters connected to output terminal 55, and their bases connected to node 49.

The output stage 44 comprises an NPN bipolar transistor 61 and a PNP bipolar transistor 62 having their collectors connected to power supply terminals 47 and 48, respectively, their emitters connected to output terminal 63 and their bases connected to node 54.

When the signal $V_{IN}$ at input terminal 51 is low, transistors 46, 52, 57, 59 and 61 are off, transistors 45, 53, 56, 58 and 62 are on, resulting in output terminal 55 being high and output terminal 63 being low. When the input signal $V_{IN}$ is high, the inverse is true.

The invention described herein can be used for internal circuits to improve Very Large Scale Integration (VLSI) performance as well as output drivers. In a gate array or standard cell based VLSI, the device size is uniform for ease of physical design. As a result, the delay degradation per unit load for CMOS is generally different for different circuit functions due to the difference in output impedance of various circuit configurations. For the invention described herein, the unit load degradation is practically the same for all circuit functions because the bipolar push-pull transistors isolate the CMOS circuits from the loading. This leads to ease of applications in semi-custom environments. The bipolar transistors also make ECL input/output (i.e., high performance RAM's) much easier to achieve. The invention can also be used in word line drivers, bit line drivers and sense amplifiers to improve performance.

Another application is a gate array with mixed TTL and ECL input/output on the same chip. This feature is desirable in high performance disk drives, test systems and high speed graphics applications.

By now it should be appreciated that there has been provided a BICMOS circuit having improved output voltage switching speed, low power requirements, high input impedance, high noise immunity, no body effect, and high current output capability and further providing an increased output voltage swing.

I claim:

1. A circuit comprising:
   a first supply voltage terminal;
   a second supply voltage terminal
   an input terminal;
   a first output terminal;
   a first bipolar transistor coupled between said first supply voltage terminal and said first output terminal;
   a second bipolar transistor coupled between said first output terminal and said second supply voltage terminal;
   first means coupled between said first and second supply voltage terminals and having an input coupled to said input terminal and an output coupled to a base of said first bipolar transistor and said second bipolar transistor for providing a voltage for biasing said first and second transistors, said first means providing a high impedance to said input terminal;
   second means coupled between said first and second supply voltage terminals and having an input coupled to said input terminal and an output coupled to said output terminal for providing a voltage at said first output terminal that varies in magnitude from the voltage on said first and second supply voltage terminals in response to an input signal on said input terminal, said second means providing a high impedance to said input terminal; and
   third means coupled between said first and second supply voltage terminals and having an input coupled to said first output terminal and an output coupled to said second means for biasing said second means.

2. The circuit according to claim 1 further comprising:
   a second output terminal;
   a third bipolar transistor coupled between said first supply voltage terminal and said second output terminal, and having a base coupled to said output of said third means; and
   a fourth bipolar transistor coupled between said second output terminal and said second supply voltage terminal, and having a base coupled to said output of said third means.

3. The circuit according to claim 1 wherein said second means comprises:
   a first CMOS transistor having a source coupled to said first supply voltage terminal, a drain coupled to said first output terminal, and a gate coupled to said output of said third means; and
   a second CMOS transistor having a source coupled to said second supply voltage terminal, a drain coupled to said first output terminal, and a gate coupled to said input terminal.

4. The circuit according to claim 3 wherein said third means comprises:
   a third CMOS transistor having a source coupled to said first supply voltage terminal, a drain coupled to said gate of said first CMOS transistor, and a gate coupled to said first output terminal; and
   a fourth CMOS transistor having a source coupled to said second supply voltage terminal, a drain coupled to said gate of said first CMOS transistor, and a gate coupled to said first output terminal.

5. The circuit according to claim 4 wherein said first means comprises:
   a fifth CMOS transistor having a source coupled to said first supply voltage terminal, a drain coupled to said bases of said first and second bipolar transistors, and a gate coupled to said input terminal; and
   a sixth CMOS transistor having a source coupled to said second supply voltage terminal, a drain coupled to said bases of said first and second bipolar transistors, and a gate coupled to said input terminal.

6. The circuit according to claim 5 further comprising:
   a second output terminal;
   a third bipolar transistor coupled between said first supply voltage terminal and said second output terminal, and having a base coupled to the drains of said third and fourth CMOS transistors; and
   a fourth bipolar transistor coupled between said second output terminal and said second supply voltage terminal, and having a base coupled to the drains of said third and fourth CMOS transistors.

* * * * *